United States Patent
Grünwald et al.

(10) Patent No.: US 9,806,389 B2
(45) Date of Patent: Oct. 31, 2017

(54) HEAT EXCHANGER, PARTICULARLY FOR A MOTOR VEHICLE

(71) Applicant: MAHLE INTERNATIONAL GMBH, Stuttgart (DE)

(72) Inventors: Jürgen Grünwald, Ludwigsburg (DE); Florin Moldovan, Stuttgart (DE); Manuel Wehowski, Stuttgart (DE)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 201 days.

(21) Appl. No.: 14/650,971

(22) PCT Filed: Dec. 3, 2013

(86) PCT No.: PCT/EP2013/075428
§ 371 (c)(1),
(2) Date: Jun. 10, 2015

(87) PCT Pub. No.: WO2014/090641
PCT Pub. Date: Jun. 19, 2014

(65) Prior Publication Data
US 2017/0018825 A1    Jan. 19, 2017

(30) Foreign Application Priority Data

Dec. 10, 2012 (DE) ........................ 10 2012 222 635

(51) Int. Cl.
*H01M 10/6572* (2014.01)
*H01M 10/625* (2014.01)
(Continued)

(52) U.S. Cl.
CPC .... *H01M 10/6572* (2015.04); *B60H 1/00278* (2013.01); *B60H 1/00478* (2013.01);
(Continued)

(58) Field of Classification Search
CPC .. F28F 3/08; F28F 3/12; F28D 7/0025; F28D 2021/008; F25B 21/04; F25B 2321/0252;
(Continued)

(56) References Cited

U.S. PATENT DOCUMENTS 5,547,019 A * 8/1996 Iacullo ............... B60H 1/00478
123/563
5,561,981 A * 10/1996 Quisenberry ........... F25B 21/02
165/133

(Continued)

FOREIGN PATENT DOCUMENTS

CN          1299950 A       6/2001
CN        201476411 U       5/2010
(Continued)

OTHER PUBLICATIONS

Abstrat of JP 4719747 to Munakata et al.*
(Continued)

*Primary Examiner* — Mohammad M Ali
(74) *Attorney, Agent, or Firm* — Paul D. Strain, Esq.; Strain & Strain PLLC (57) ABSTRACT

The invention relates to a heat exchanger, particularly for a motor vehicle, comprising a first component with a first duct, a second component with a second duct and a thermoelectric element for generating a heat flow, wherein a first fluid of a first fluid circuit can be caused to flow through the first duct to control the temperature of a first external component, wherein a second fluid of a second fluid circuit can be caused to flow through the second duct, which is fluidically separated from the first duct, to control the temperature of a second external component, and wherein the at least one thermoelectric element is arranged between the first and second components, contacting same thermally.

15 Claims, 8 Drawing Sheets

(51) Int. Cl.
*H01L 35/30* (2006.01)
*B60H 1/00* (2006.01)
*B60H 1/14* (2006.01)
*F28F 3/08* (2006.01)
*F25B 21/04* (2006.01)
*F28F 3/12* (2006.01)
*F28D 7/00* (2006.01)
*B60H 1/22* (2006.01)
*F28D 21/00* (2006.01)

(52) U.S. Cl.
CPC ............. *B60H 1/143* (2013.01); *F25B 21/04* (2013.01); *F28D 7/0025* (2013.01); *F28F 3/08* (2013.01); *F28F 3/12* (2013.01); *H01L 35/30* (2013.01); *H01M 10/625* (2015.04); *B60H 2001/2271* (2013.01); *B60H 2001/2275* (2013.01); *F25B 2321/0252* (2013.01); *F28D 2021/008* (2013.01); *H01M 2220/20* (2013.01)

(58) Field of Classification Search
CPC ................ B60H 1/143; B60H 1/00478; B60H 2001/2271; B60H 1/00278; B60H 2001/2275; H01M 10/6572; H01M 10/625; H01M 2220/20; H01L 35/30
USPC ............................................................ 62/3.2
See application file for complete search history.

(56) References Cited

U.S. PATENT DOCUMENTS

| | | | |
|---|---|---|---|
| 6,615,590 B1 | 9/2003 | Yaegashi et al. | |
| 2002/0148234 A1* | 10/2002 | Bell | F02G 1/043 62/3.3 |
| 2004/0068991 A1* | 4/2004 | Banney | F28F 1/045 62/3.7 |
| 2004/0112571 A1* | 6/2004 | Kenny | F04B 17/00 165/80.3 |
| 2005/0133206 A1* | 6/2005 | Scott | B60H 1/00278 165/122 |
| 2005/0247446 A1* | 11/2005 | Gawthrop | B60H 1/004 165/202 |
| 2006/0075758 A1* | 4/2006 | Rice | B60H 1/00478 62/3.3 |
| 2008/0087024 A1* | 4/2008 | Hood | F25B 21/02 62/3.2 |
| 2008/0173342 A1* | 7/2008 | Bell | F02G 1/043 136/201 |
| 2009/0134565 A1 | 5/2009 | Duan | |
| 2011/0067742 A1* | 3/2011 | Bell | F01N 3/043 136/204 |
| 2011/0265838 A1* | 11/2011 | Kambe | H01L 35/30 136/223 |
| 2012/0247526 A1* | 10/2012 | Okuda | H01L 35/30 136/225 |

FOREIGN PATENT DOCUMENTS

| | | |
|---|---|---|
| DE | 198 13 241 A1 | 10/1999 |
| DE | 10 2009 058 673 A1 | 6/2011 |
| DE | 10 2010 013 467 A1 | 10/2011 |
| DE | 10 2012 207 612 A1 | 11/2013 |
| EP | 2 506 323 A2 | 10/2012 |
| FR | 2 702 829 A1 | 9/1994 |
| GB | 2 359 617 A | 8/2001 |
| WO | WO 2007/026432 A1 | 3/2007 |

OTHER PUBLICATIONS

Translation of JP 4719747 to Munakata et al.*
International Search Report, PCT/EP2013/075428, dated Mar. 20, 2014, 3 pgs.
German Search Report, Appl. No. 10 2012 222 635.4, dated Dec. 4, 2013, 5 pgs.

* cited by examiner

HEAT EXCHANGER, PARTICULARLY FOR A MOTOR VEHICLE

CROSS-REFERENCE TO RELATED PATENT APPLICATIONS

This application is a National Stage of International Application No. PCT/EP2013/075428, filed Dec. 3, 2013, which is based upon and claims the benefit of priority from prior German Patent Application No. 10 2012 222 635.4, filed Dec. 10, 2012, the entire contents of all of which are incorporated herein by reference in their entirety.

TECHNICAL FIELD

The invention relates to a heat exchanger, particularly for a motor vehicle, as claimed in the preamble of claim 1.

PRIOR ART

Energy efficiency plays an important role within the context of the increasing electrification of motor vehicles, in particular with regard to heating and cooling tasks in the motor vehicle. Inefficient heating and cooling in electric vehicles operated by high-performance batteries may result, for example, in a very significant reduction in the range of the vehicle.

With the use of modern high-performance batteries which are constructed from a number of individual cells, such as for example in electric or hybrid vehicles, the temperature of the high-performance battery during operation of the motor vehicle has to be within a specific range in order to ensure the efficiency, functional capability and safety of the motor vehicle. On the one hand, below a suitable operating temperature the efficiency of the battery cells is reduced very considerably and the cells generate a nigh power loss. On the other hand, above a suitable operating range processes take place within the cells which lead to irreversible damage. Moreover, to avoid uneven ageing of individual battery cells, and increased ageing associated therewith, the temperature differences inside the individual cells and in the entire battery stack should not exceed specific limit values. For these reasons, it is necessary to control the temperature of the battery in the form of cooling or heating.

A heat exchanger which has two fluid sides is known, whereby two independent circuits may be produced for controlling the temperature of different components of a motor vehicle. Such a heat exchanger is designed in a layered construction, wherein the two fluid sides are in contact with one another via thermoelectric elements. Such thermoelectric elements are disclosed in DE 10 2009 058 673 A1, wherein with the application of current to the thermoelectric elements, heat is pumped from one fluid to the other fluid, without the fluids coming into contact or being mixed with one another. One fluid side in this case is part of a fluid circuit for controlling the temperature of components, for example a high voltage battery of a motor vehicle. The other fluid side is part of a fluid circuit for controlling the temperature of a further component and/or for the transfer of heat between the fluid circuit and the surroundings.

With the layered construction of this heat exchanger, it is a drawback that during switching processes, for example when switching a battery cooling circuit on and off, peaks are produced in the air outlet temperature. Similarly, peaks are produced in the heat discharged from the battery when the battery cooling system is switched on.

DESCRIPTION, OBJECT, SOLUTION AND Advantages OF THE INVENTION

It is the object of the invention to provide a heat exchanger which permits the required cooling and heating of components, in particular of high performance batteries in hybrid and electric vehicles.

This is achieved by the features of claim 1, according to which the first and second components and the thermoelectric element form a module with at least two fluid-connecting elements which are compatible with the respective fluid-connecting elements of a further such module, wherein a first fluid-connecting element is connected to the first duct and a second fluid-connecting element is connected to the second duct. This has the advantage that such a heat exchanger is able to act between two cooling circuits and permits the required cooling and heating of the components. By the use of components, the mounting of the heat exchanger is simplified, wherein two fluid circuits which are separated from one another may be easily produced. At the same time, the simplification of the mounting results in a reduction in the production costs of the heat exchanger.

Advantageously, the module comprises four compatible fluid-connecting elements, wherein the first fluid-connecting element as the inlet duct and the second fluid-connecting element as the outlet duct for the first fluid are connected to the first duct of the first component, and wherein the third fluid-connecting element as the inlet duct and the fourth fluid-connecting element as the outlet duct for the second fluid are connected to the second duct of the second component. As a result, a compact, space-saving heat exchanger is produced.

In one embodiment a plurality of modules are arranged relative to one another such that the second component of a first module and the first component of a second module are arranged opposite one another.

Alternatively, a plurality of modules are arranged relative to one another such that in each case the first components and/or in each case the second components are arranged opposite one another.

In one embodiment, a thermoelectric element or an insulating element is arranged between two modules arranged opposite one another, said element placing the two modules in thermal contact. At the same time, in addition to thermal insulation, such an insulating element prevents a leakage flow of thermal fluid. In the case where two warm sides or two cold sides are respectively present in the first prefabricated component and are thus stacked directly on top of one another, such an insulating element is not necessarily required from the thermo-technical point of view. If the insulating element is designed to be flexible, it serves at the same time for the flexible support of the modular units so that by using an additional retaining device, on the one hand, a fixing of the modular units is ensured whilst, on the other hand, the different modular units are not rigidly connected together, whereby undesirable stresses are reduced.

In one variant, the first, second, third and fourth fluid-connecting elements of a plurality of modules arranged in each case opposite one another, are accordingly connected, in particular plugged, together. As a result, the modular heat exchanger may be particularly easily mounted.

Advantageously, the openings of the connections of the fluid-connecting elements of one module to those of the modules arranged opposite, are arranged parallel to a plane which is formed by the surface of the first or second component.

In one embodiment, the first and second components are of identical construction and/or the flow geometry is identical within one component. The use of components of identical construction further reduces the production costs for such a heat exchanger.

In one development, the second component is rotated by 180° about a first axis, which preferably extends in a transverse dimension of the prefabricated component, relative to the first component to form the module. With this arrangement, both fluids flow in opposing directions of flow through the modules in the same manner as through the entire heat exchanger. This embodiment is still advantageous if fluid-connecting elements are present on the prefabricated components, said fluid-connecting elements connecting the prefabricated components cc the respective first or second cooling circuit. By the rotation of the first and second prefabricated components relative to one another, it is taken into account that the fluid-connecting elements are positioned such that flat contact between the first and second prefabricated components is possible at any Alternatively, the second component is rotated by about a second axis, which is configured approximately perpendicular to the first axis and which preferably extends in a longitudinal dimension of the prefabricated component, relative to the first component to form the module. Furthermore, this embodiment results in a space-saving arrangement of the first and second components. In this case, the two fluids flow through the entire heat exchanger the same flow direction, whilst the two different fluids flow through the individual modular units in opposing flow directions.

In one variant, the second component is rotated in parallel relative to the first component by 90° about an axis perpendicular to the surface, to form the module.

Advantageously, the first and second components in each case consist of a set of pipes guided in parallel to one another, preferably flat pipes, in each case an inlet collector and an outlet collector for the respective fluid being fastened to the ends thereof, wherein the inlet collector and the outlet collector have at least one respective fluid-connecting element. Such components are sufficiently well known in air-conditioning technology and thus may be used for this application. In this manner, the production of specific components for the heat exchanger is dispensed with.

In one embodiment, the first and second components are configured as a cooling plate. As such cooling plates are produced by mass production, the costs for the heat exchanger are considerably reduced by the use of said cooling plates for the proposed thermoelectric heat exchanger.

In one variant, the at least one thermoelectric element is configured as a Peltier element. In the case of heating, the Peltier elements serve as a heat pump for heating the component to be brought to the correct temperature, whilst in the case of cooling, however, the Peltier elements ensure the cooling of the corresponding component. The required temperature control is carried out by a variable application of current to the Peltier elements in the heat exchanger, with the possible reversal of the direction of current.

In one embodiment, the at least one thermoelectric element is pressed or connected by a material connection to the first and second components. This pressing or material connection produces a reliable thermal contact with the two prefabricated components.

In one embodiment, a plurality of modules are stacked and the stack is held together by a retaining device. The use of modules permits the design of different heat exchangers having different power classes with different thermal output. Heat exchangers having different power classes, therefore, may be easily produced simply by the number of modules used, without additional components and additional method steps being required.

Further advantageous embodiments are disclosed by the following description of the figures and by the sub-claims.

BRIEF DESCRIPTION OF THE DRAWINGS

The invention is described in more detail hereinafter on the basis of at least one exemplary embodiment with reference to the drawings, in which.

PREFERRED EMBODIMENT OF THE INVENTION

Figure 1:
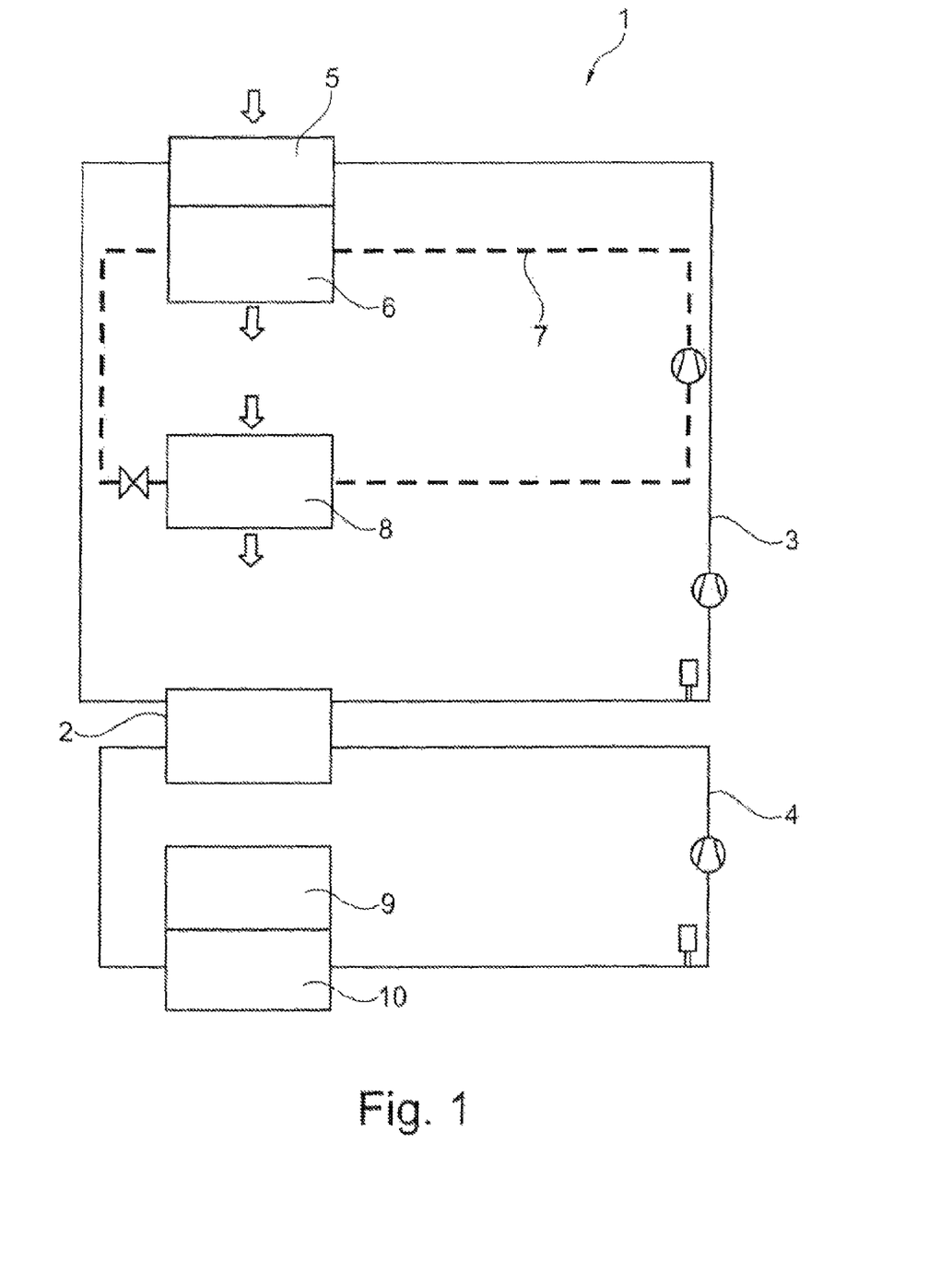
FIG. 1 shows a first exemplary embodiment of a heat exchanger system with the heat exchanger according to the invention, FIG. 2 show a first exemplary embodiment of the heat exchanger according to the invention.

FIG. 1 shows a first exemplary embodiment of a heat exchanger system 1 comprising the thermoelectric heat exchanger 2 according to the invention. The heat exchanger 2 is configured as a coolant/coolant-temperature control unit with thermoelectrics and is arranged between two cooling circuits, namely the primary circuit 3 and the secondary circuit 4. In this case a first fluid configured as coolant flows through the primary circuit 3, whilst a second fluid also configured as coolant flows through the secondary circuit 4. A low temperature radiator 5 is incorporated in the primary circuit 3 in addition to the heat exchanger 2, said low temperature radiator acting via a capacitor 6 on an air-conditioning circuit 7 within a motor vehicle. An air-conditioning evaporator 8 is arranged at the same time in the air-conditioning circuit 7, a vehicle interior being able to be cooled or heated thereby. The temperature of a high voltage battery 9 arranged in the motor vehicle is controlled in the secondary circuit 4, said high voltage battery being fastened to a cooling plate 10. The cooling plate 10 in this case is incorporated in the secondary circuit 4.

Figure 2:
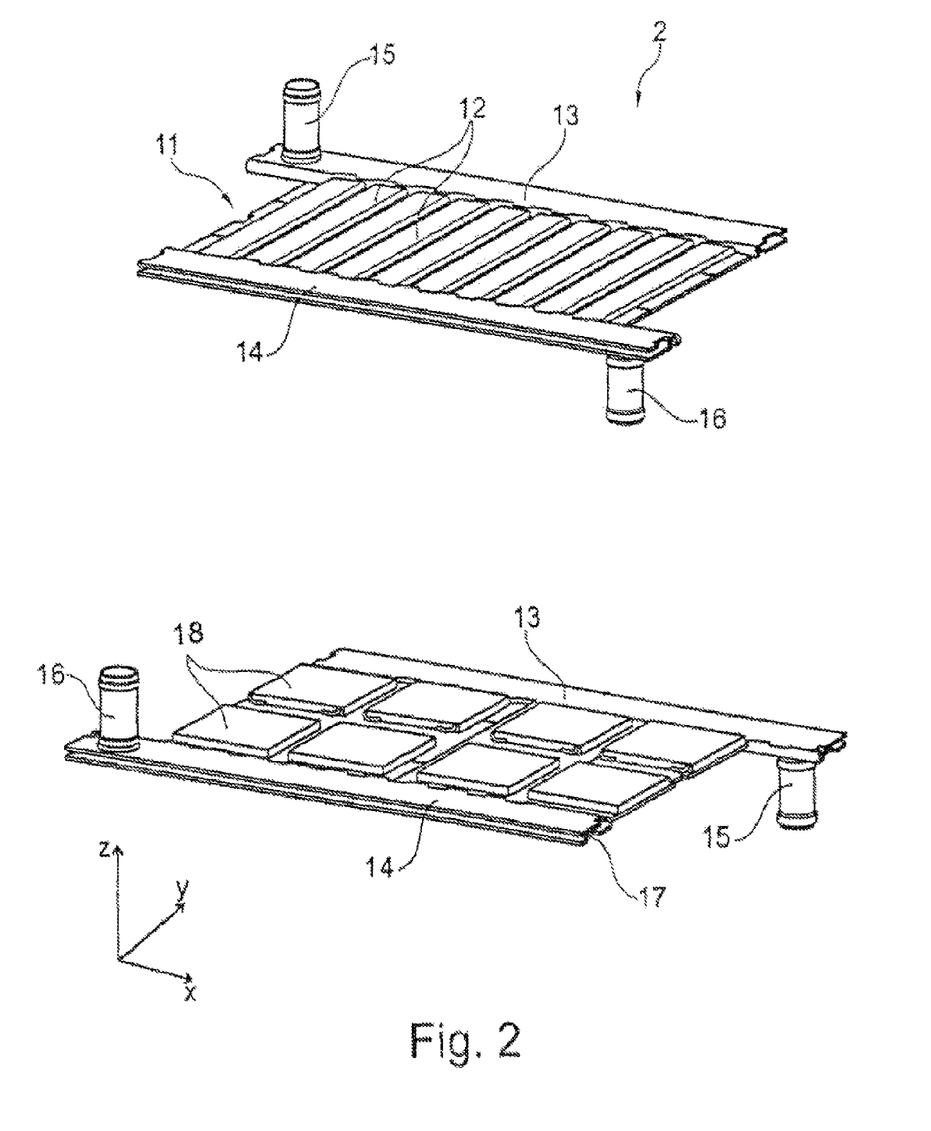

In FIG. 2, a first exemplary embodiment of the heat exchanger 2 according to the invention is shown. The heat exchanger 2 in this case consists of a first prefabricated component 11 which is configured, for example, as a cooling plate. This first prefabricated component 11 has a plurality or flat pipes 12 extending parallel to one another, the ends thereof being defined by an inlet collector 13 and an outlet collector 14 for a first fluid. Outside the extent of the flat pipes 12 a fluid-connecting element 15 is formed on the inlet collector 13 as the inlet pipe for the secondary circuit 4, whilst on the diagonally opposing side a fluid-connecting element 16 is formed as the outlet pipe on the outlet collector 14. A second component 17 of the heat exchanger 2, which is incorporated in the primary circuit 3, is configured identically to the first prefabricated component 11. By means of the fluid-connecting elements 15, 16 the second component 17 is incorporated in the primary circuit 3. In this case, the second prefabricated component 17 is rotated relative to the first prefabricated component 11 by 180° about the Y-axis.

A plurality of Peltier elements 18 of flat, preferably rectangular, configuration are adhesively bonded onto the side of the second component 17 opposing the first component 11. The first and second prefabricated components 11, 17 are pressed together via the Peltier elements 18, wherein the Peltier elements 18 are placed in thermal contact with both prefabricated components 11, 17. In addition to the pressing, an adhesive bonding of the Peltier elements 18 to the prefabricated elements 11, 17 preferably so the flat pipes 12 of the two prefabricated elements 11, 17, may also be carried out.

Figure 3:
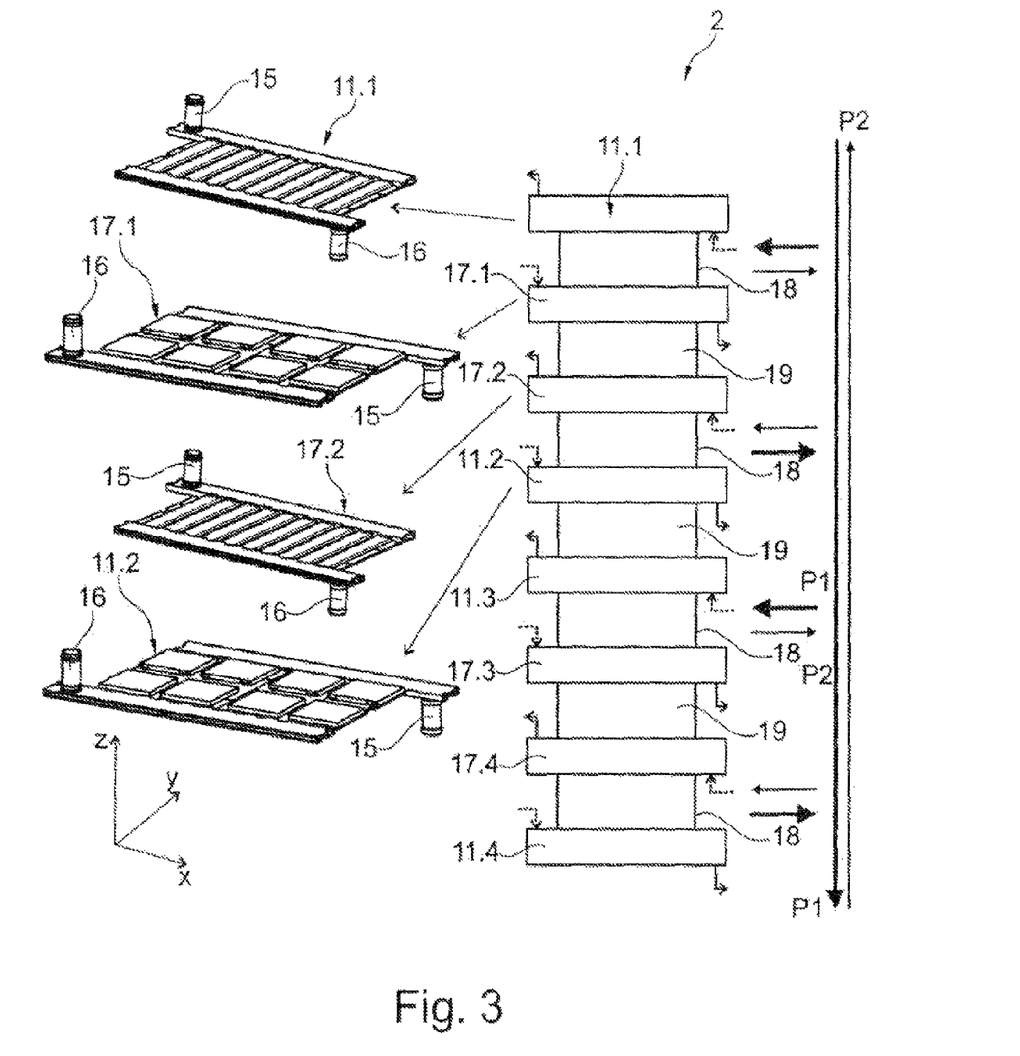
FIG. 3 shows a further exemplary embodiment of the heat exchanger according to the invention.

A heat exchanger 2 thus produced forms modules 11, 17 as shown in FIG. 3. A plurality of such similar modules 11.1, 17.1; 11.2, 17.2; 11.3, 17.3; 11.4, 17.4 may be stacked in any manner together. In the stacked construction the modules 11.1, 17.1; 11.2, 17.2; 11.3, 17.3; 11.4, 17.4 are maintained in their orientation and stacked in the z-direction. If the fluid-connecting elements 15, 16 as pipe connectors are guided vertically out of the prefabricated components 11, 12, an alternating arrangement of the modules 11.1, 17.1; 11.2, 17.2; 11.3, 17.3; 11.4, 17.4 in the (+/−) y-direction results, such that the construction in the z-direction is designed to be compact without the collision of the fluid-connecting elements 15, 16. If the fluid-connecting elements 15, 16 are flat and guided outwardly in the x-direction or y-direction, not shown further, the modules 11.1, 17.1; 11.2, 17.2; 11.3, 17.3; 11.4, 17.4 may arranged to be congruent in the z-direction.

An insulating element 19 is incorporated between the individual modules 11.1, 17.1; 11.2, 17.2; 11.3, 17.3; 11.4, 17.4. In order to reduce the overall size of the heat exchanger 2, such an insulating element 19 could be dispensed with from the heat technology point of view since, in the exemplary embodiment provided, only two respective warm sides or two cold sides are always directly stacked on top or one another. However, these insulating elements 19, particular if they are of flexible design, form a support for the modules 11.1, 17.1; 11.2, 17.2; 11.3, 17.3; 11.4, 17.4 so that by using an additional retaining device, not shown further, on the one hand, a fixing of the modules 11.1, 17.1; 11.2, 17.2; 11.3, 17.3; 11.4, 17.4 is ensured whilst, on the other hand, the different modules 11.1, 17.1; 11.2, 17.2; 11.3, 17.3; 11.4, 17.4 are not rigidly connected together. In the exemplary embodiment described in connection with FIG. 3, fluid flows through all modules 11.1, 17.1; 11.2, 17.2; 11.3, 17.3; 11.4, 17.4 and the entire heat exchanger 2 in opposing flow directions, which is shown by the different arrows P1 and P2 for the secondary and primary circuits 4, 3. This has the advantage that on all of the Peltier elements 18 there is a similar temperature difference between the cold and warm sides, which is important for an identical mode of operation of all of the Peltier elements 18 when the same current is applied to the Peltier elements 18.

As the pattern of the fluid connections between the individual modules 11.1, 17.1; 11.2, 17.2; 11.3, 17.3; 11.4, 17.4 is repeated, the fluid connections of the individual fluid-connecting elements are always present on only one connection side. This has the result of reducing the cost of pipework between the fluid-connecting elements 15, 16. In all modules 11.1, 17.1; 11.2, 17.2; 11.3, 17.3; 11.4, 17.4 the flow direction of the fluids is maintained on fluid-connecting elements in the same position. This means that in the case of congruence in the z-direction, the fluid-connecting elements 15, 16, with a fixed x-y coordinate, are always an inlet duct or an outlet duct.

The fluid connections may be ensured, for example by flexible hoses, so that stresses between the modules 11.1, 17.1; 11.2, 17.2; 11.3, 17.3; 11.4, 17.4 due to the different temperatures of the cold and warm sides are minimized.

Figure 4:
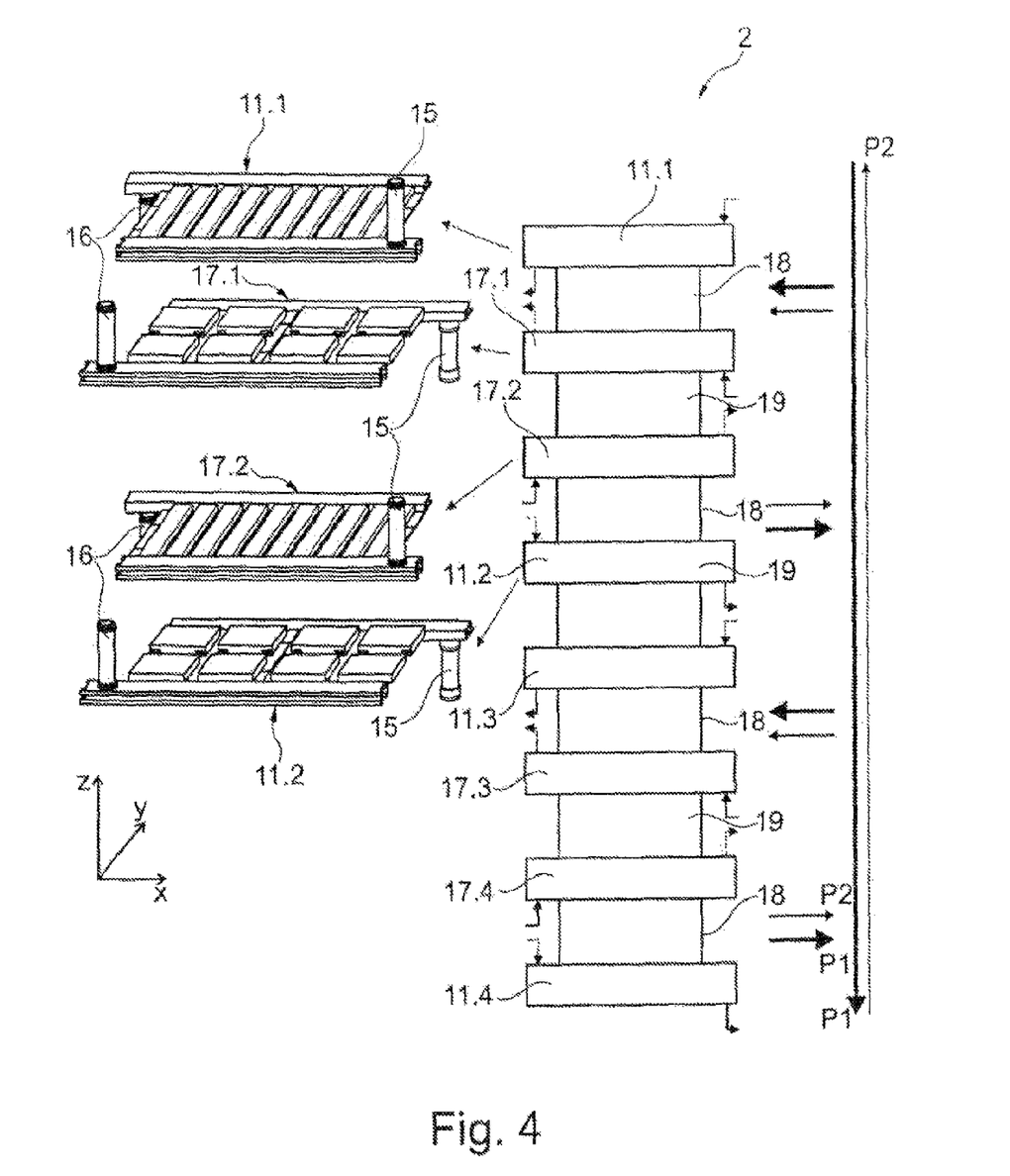
FIG. 4 shows a further exemplary embodiment of the heat exchanger according to the invention.

In a further embodiment of the heat exchanger 2 according to FIG. 4, the first component 11 is rotated by 180° about the x-axis relative to the second component 17. In this case, the first and second components 11, 17 are of identical configuration, wherein by this rotation the two components 11, 17 are combined in a space-saving manner to form a modular unit 11.1, 17.1; 11.2, 17.2; 11.3, 17.3; 11.4, 17.4. In the installed state, the Peltier elements 18, which are applied flat onto the second component 17, come into contact with the first component 11. In the stacked construction, in this exemplary embodiment the orientations of the modules 11.1, 17.1; 11.2, 17.2; 11.3, 17.3; 11.4, 17.4 are also maintained, wherein said modules are stacked in the z-direction. If the fluid-connecting elements 15, 16, also designed as pipe connectors in this exemplary embodiment, are guided vertically out of the first and second components 11, 17, an alternating arrangement of the modular units in the (+/−) y-direction may be implemented so that the construction in the z-direction may also be designed to be compact without the collision of the fluid-connecting elements 15, 16. If the fluid-connecting elements 15, 16 are flat and guided outwardly in the x-direction or y-direction, the modules 11.1, 17.1; 11.2, 17.2; 11.3, 17.3; 11.4, 17.4 may be arranged so as to be congruent in the z-direction.

Also, one respective thermal insulating element 19 is provided here between the modules 11.1, 17.1; 11.2, 17.2; 11.3, 17.3; 11.4, 17.4. The two different fluids flow through the heat exchanger 2 formed from a plurality of modules 11.1, 17.1; 11.2, 17.2; 11.3, 17.3; 11.4, 17.4 in the same flow direction, whilst fluid flows through the individual modules 11.1, 17.1; 11.2, 17.2; 11.3, 17.3; 11.4, 17.4 in opposing flow directions. This is revealed by arrows P1 and P2, which identify the flow direction of the fluids. This variant may be used, in particular, in the case of short flow paths in the flat pipes 12 where the individual Peltier elements 18 have a low output. The pattern of the fluid connection between the different modules 11.1, 17.1; 11.2, 17.2; 11.3, 17.3; 11.4, 17.4 is repeated, wherein the fluid connection of the individual fluid-connecting elements 15, 16 is always only on one connection side. This has the result of reducing the cost of pipework between the fluid-connecting elements 15, 16. In contrast to the exemplary embodiment according to FIG. 3, however, in every second modular unit the flow direction varies on the fluid-connecting elements 15, 16 in the identical x/y position. This means that in the case of congruence in the s-direction, the fluid-connecting elements with a fixed x/y coordinate are always alternately an inlet duct and an outlet duct.

Figure 5:
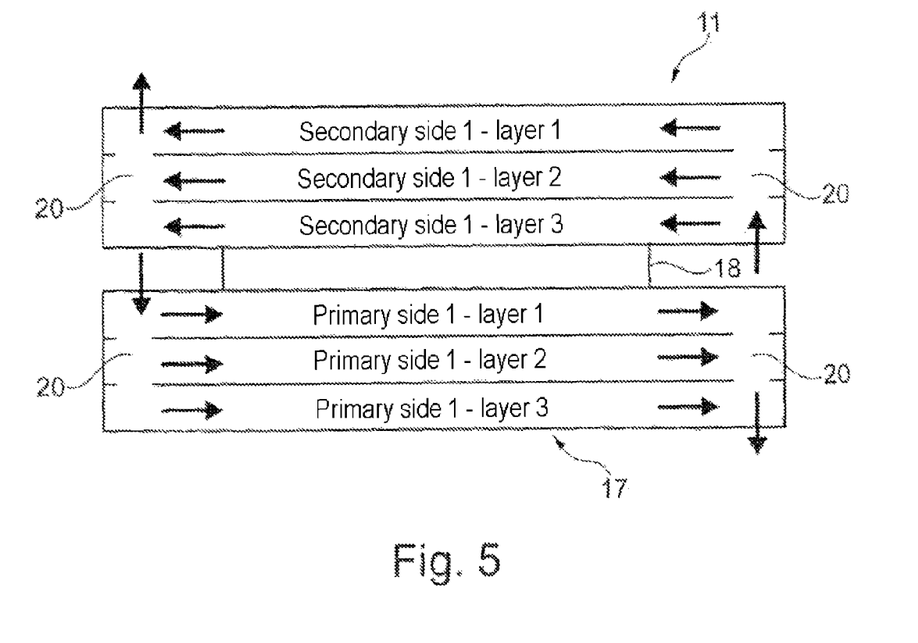
FIG. 5 shows a further exemplary embodiment of the heat exchanger according to the invention.

Generally, a fluid-conducting component 11, 17 may also be designed to be multilayered in the z-plane, as is visible in FIG. 5. In this case, a plurality of first components 11 are superimposed in three layers, whilst the associated second components 17 are also arranged in three layers, wherein the Peltier elements 18 are fastened between the two stacks. In this arrangement, the number of external fluid-connecting elements 15, 16 is not altered. The multilayered components 11, 17 are in this case connected internally, such as for example by through-holes 20 in the collectors, not shown further.

Figure 6:
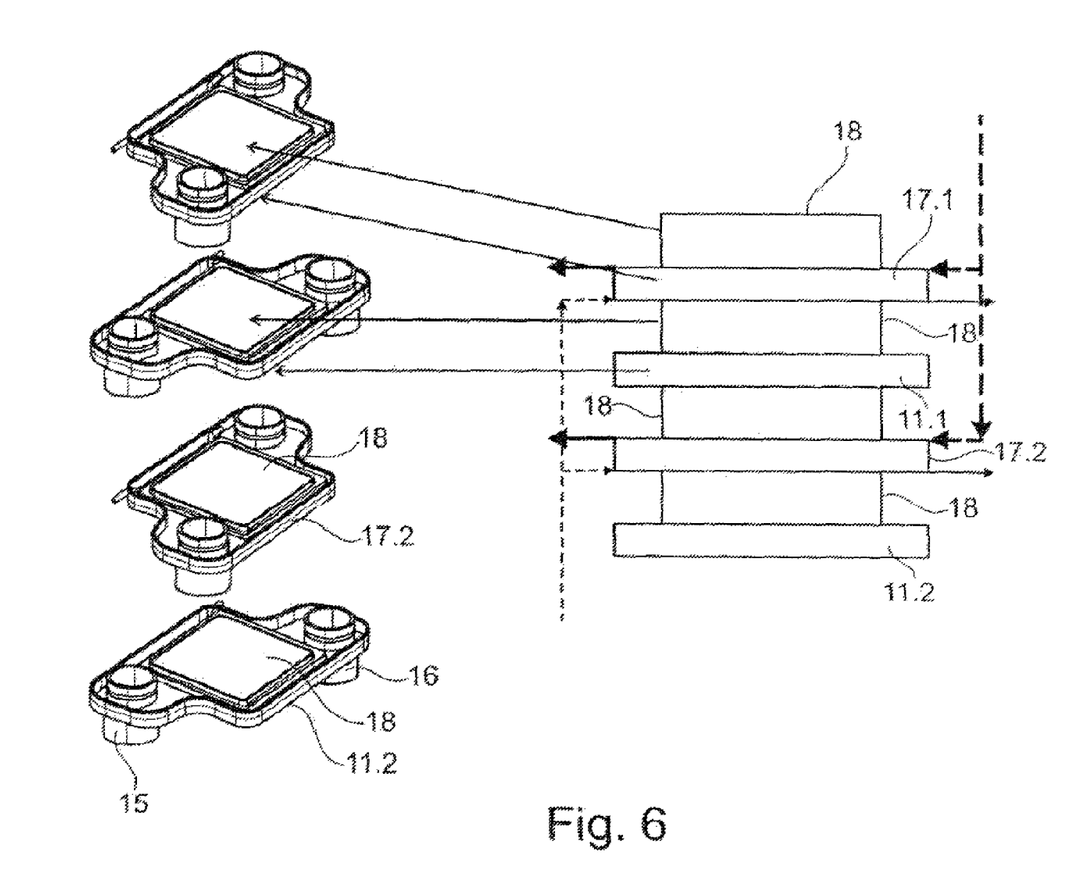
FIG. 6 shows a further exemplary embodiment of the heat exchanger according to the invention.

In FIG. 6, a further exemplary embodiment of the heat exchanger according to the invention is shown. In each case a thermoelectric element 18 is placed on the first and second components 11.1, 17.1; 11.2, 17.2. The first and second components 11.1, 17.1; 11.2, 17.2 are plugged together to form a module, such that the thermoelectric elements 18 are always in direct contact with the first or second component 11.1, 17.1; 11.2, 17.2 located thereabove. In this case, the thermoelectric element 18 fastened to the upper second component 17.1 is exposed. The components 11.1, 17.1; 11.2, 17.2 in this case are rotated parallel to one another by 90° about an axis perpendicular to the surface of the respective component 11.1, 17.1; 11.2, 17.2 to form the module. The respective fluid-connecting elements 15, 16 facing in the same direction of the directly opposing first and second components 11.1, 17.1; 11.2, 17.2 in this case form a rectangle and protrude between the component located thereabove and therebelow. As a result, it is possible to mount the inlets and/or outlets of the ducts conducting the fluids in a simple manner.

Figure 7:
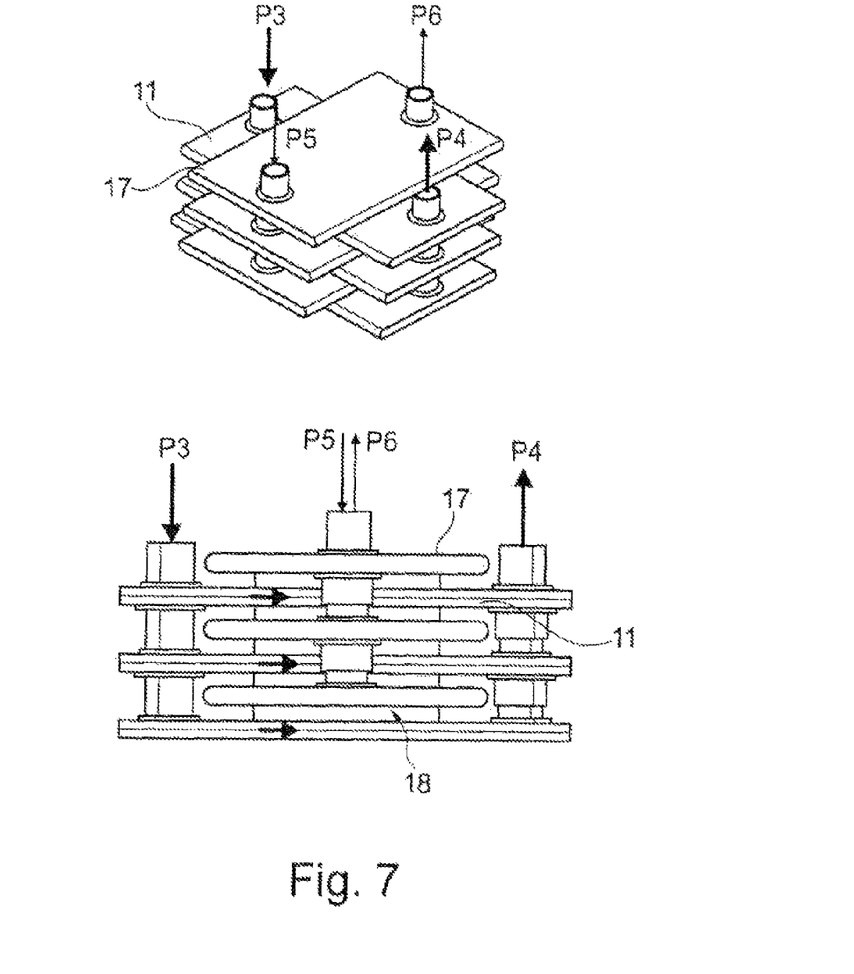
FIG. 7 shows a further exemplary embodiment of the heat exchanger according to the invention.

FIG. 7 shows the variant of the heat exchanger shown in FIG. 6, in the assembled state, wherein the diagonally opposing fluid-connecting elements, which are plugged into one another, in each case form an inlet and/or the outlet for one respective fluid. Thus the fluid-connecting elements, which are identified by the arrow P3, show the inlet of the first, fluid, whilst, the fluid-connecting elements denoted by the arrow P4, show the outlet of the first fluid. Transversely thereto, the fluid-connecting elements denoted by the arrow P5 form the inlet of the second fluid and the fluid-connecting elements denoted by arrow P6 form the outlet of the second fluid.

Figure 8:
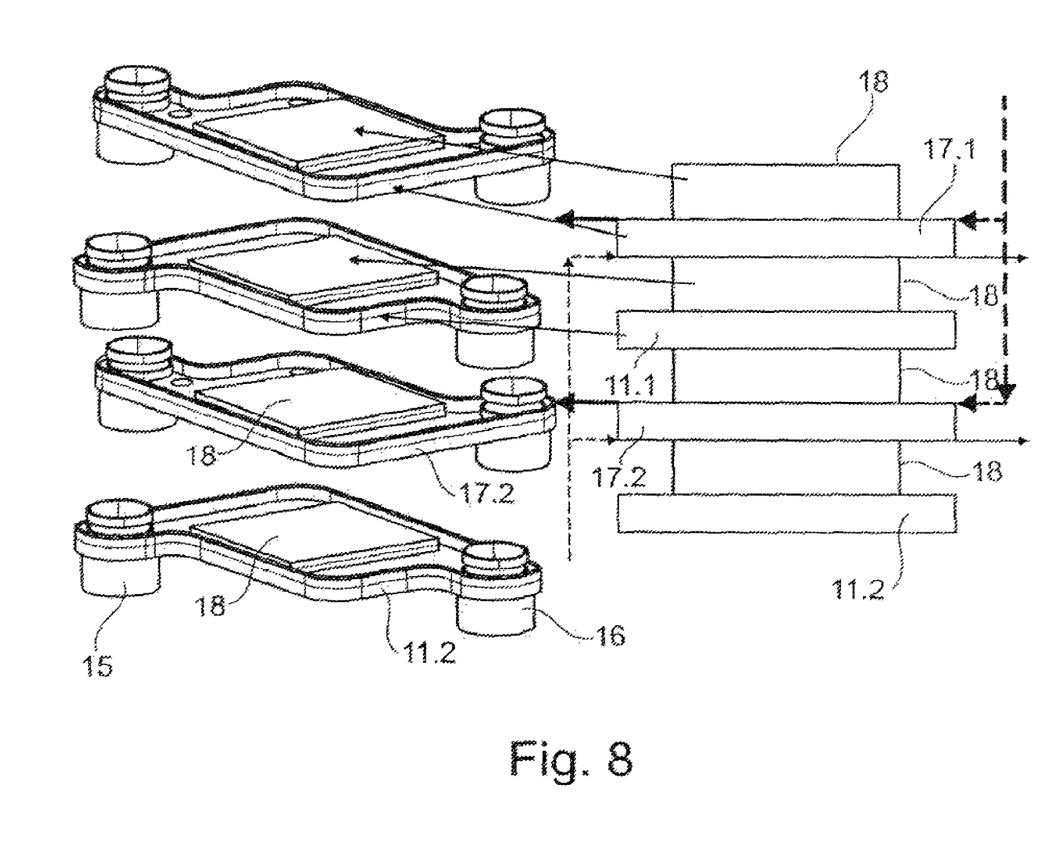
FIG. 8 shows a further exemplary embodiment of the heat exchanger according to the invention.

In the heat exchanger according to FIG. 8, the fluid-connecting elements of each component 11.1, 17.1; 11.2, 17.2 are superimposed, wherein said fluid-connecting elements may be simply plugged into one another in order to produce the first duct for the first fluid and the second duct for the second fluid.

The proposed solution provides a control of the temperature of the components, which is not dependent on coolant, so that an air-conditioning circuit is not required for the heating and cooling. This provides the option of an independent temperature control system. By means of the independence of the proposed thermoelectric heat exchanger 2 from an air-conditioning system operated by coolant, in a motor vehicle, undesirable effects on the air-conditioning evaporator may be avoided. The heat exchanger 2 according to the invention combines the heating and cooling function in one unit. Essential advantages are in this case the use of the same parts and the modular design for different power classes, based on the design of the modular cooling plate. Moreover, a space-saving design with efficient thermal transmission is implemented by a suitable design of the modular units. By means of the components 11, 17 and by the application of current to the Peltier elements 18, the required cooling and heating of the high voltage battery 9 may be undertaken. Additionally, COP (coefficient of performance) values of greater than 1 may be achieved during the cooling and heating.

The invention claimed is:

1. A heat exchanger comprising:
a first component with a first duct,
a second component with a second duct, and
at least one thermoelectric element for generating a heat flow,
wherein a first fluid of a first fluid circuit flows through the first duct, wherein the first fluid circuit is in thermal contact with a first external component,
wherein a second fluid of a second fluid circuit flows through the second duct which is fluidically separated from the first duct, wherein the second fluid circuit is in thermal contact with a second external component,
wherein the at least one thermoelectric element is arranged between the first and second components and is in thermal contact with the first and second components,
wherein the first and second components and the at least one thermoelectric element form a module having at least a first fluid-connecting element and a second fluid-connecting element to form two fluid-connecting elements on the first component and at least a third fluid-connecting element and a fourth fluid-connecting element to form two fluid-connecting elements on the second component,
wherein the first, second, third, and fourth fluid-connecting elements are compatible with fluid-connecting elements of a further module,
wherein the first fluid-connecting element and the second fluid-connecting element are connected to the first duct and the third fluid-connecting element and the fourth fluid-connecting element are connected to the second duct,
wherein the first and second components forming the module are of identical construction or their flow geometries are identical.

2. The heat exchanger as claimed in claim 1, wherein a plurality of modules are arranged relative to one another such that the second component of a first module and the first component of a second module are arranged opposite one another.

3. The heat exchanger as claimed in claim 1, wherein a plurality of modules are arranged relative to one another such that in each case the first components and/or in each case the second components are arranged opposite one another.

4. The heat exchanger as claimed in claim 1, wherein the at least one thermoelectric element or an insulating element is arranged between two modules arranged opposite one another, said element placing both modules in thermal contact.

5. The heat exchanger as claimed in claim 1, wherein the first, second, third and fourth fluid-connecting elements of a plurality of modules arranged in each case opposite one another, are accordingly connected together.

6. The heat exchanger as claimed in claim 1, wherein the first, second, third, and fourth fluid-connecting elements having openings, wherein openings of the connections of the fluid-connecting elements of one module to those of the modules arranged opposite are arranged parallel to a plane which is formed by the surface of the first or second component.

7. The heat exchanger as claimed in claim 1, wherein the second component is rotated by 180° about a first axis extending in a transverse dimension of the second component relative to the first component to form the module.

8. The heat exchanger as claimed in claim 7, wherein the second component is rotated by 180° about a second axis configured approximately perpendicular to the first axis and which preferably extends in a longitudinal dimension of the second component relative to the first component to form the module.

9. The heat exchanger as claimed in claim 1,
wherein the second component is rotated in parallel relative to the first component by 90° about an axis perpendicular to the surface of the first component to form the module.

10. The heat exchanger as claimed in claim 1,
wherein the first and second components each comprise a set of pipes, wherein the set up pipes comprise a plurality of pipes arranged in parallel to one another, wherein each pipe of the plurality of pipes comprises an inlet collector and an outlet collector fastened to the ends thereof, wherein the inlet collector and the outlet collector have at least one respective fluid-connecting element.

11. The heat exchanger as claimed in claim 1,
wherein the first and second components are configured as a cooling plate.

12. The heat exchanger as claimed in claim 1,
wherein the at least one thermoelectric element is configured as a Peltier element.

13. The heat exchanger as claimed in claim 1,
wherein the at least one thermoelectric element is pressed or connected by a material connection to the first and second components.

14. The heat exchanger as claimed in claim 1,
wherein a plurality of modules are stacked together and the stack is held together by a retaining device.

15. A heat exchanger comprising:
a first component with a first duct,
a second component with a second duct, and
at least one thermoelectric element for generating a heat flow,
wherein a first fluid of a first fluid circuit flows through the first duct, wherein the first fluid circuit is in thermal contact with a first external component,
wherein a second fluid of a second fluid circuit flows through the second duct which is fluidically separated from the first duct, wherein the second fluid circuit is in thermal contact with a second external component,
wherein the at least one thermoelectric element is arranged between the first and second components and is in thermal contact with the first and second components,
wherein the first and second components and the at least one thermoelectric element form a module having at least a first fluid-connecting element and a second fluid-connecting element to form two fluid-connecting elements on the first component and at least a third fluid-connecting element and a fourth fluid-connecting element to form two fluid-connecting elements on the second component,
wherein the first, second, third, and fourth fluid-connecting elements are compatible with fluid-connecting elements of a further module,
wherein the first fluid-connecting element and the second fluid-connecting element are connected to the first duct and the third fluid-connecting element and the fourth fluid-connecting element are connected to the second duct,
wherein the first and second components forming the module are of identical construction or their flow geometries are identical,
wherein a plurality of modules are arranged relative to one another such that the second component of a first module and the first component of a second module are arranged opposite one another,
wherein the at least one thermoelectric element is arranged between two modules arranged opposite one another and wherein an insulating element is arranged between two modules arranged opposite one another,
wherein the first and second components are configured as a cooling plate.

* * * * *